(12) United States Patent
Takeuchi et al.

(10) Patent No.: US 7,649,430 B2
(45) Date of Patent: Jan. 19, 2010

(54) SWITCHING DEVICE, AND TESTING APPARATUS

(75) Inventors: Hiroaki Takeuchi, Tokyo (JP); Yoshiyuki Hata, Tokyo (JP)

(73) Assignee: Advantest Corporation, Tokyo (JP)

( * ) Notice: Subject to any disclaimer, the term of this patent is extended or adjusted under 35 U.S.C. 154(b) by 284 days.

(21) Appl. No.: 11/863,278

(22) Filed: Sep. 28, 2007

(65) Prior Publication Data

US 2009/0085690 A1 Apr. 2, 2009

(51) Int. Cl.
*H01P 1/10* (2006.01)
*H03H 7/24* (2006.01)
*H01P 5/12* (2006.01)

(52) U.S. Cl. ............ 333/104; 333/101; 333/81 R
(58) Field of Classification Search ........... 333/101, 333/103, 104, 105, 107, 108, 262, 81 R
See application file for complete search history.

(56) References Cited

U.S. PATENT DOCUMENTS

| | | | | |
|---|---|---|---|---|
| 4,978,932 A | * | 12/1990 | Gupta et al. | 333/81 R |
| 6,480,708 B1 | * | 11/2002 | Tanaka et al. | 455/249.1 |
| 2009/0085579 A1 | * | 4/2009 | Takeuchi et al. | 324/555 |

FOREIGN PATENT DOCUMENTS

| | | |
|---|---|---|
| JP | 06-037776 | 5/1994 |
| JP | 08-032395 | 2/1996 |
| JP | 2000-341002 | 12/2000 |

* cited by examiner

*Primary Examiner*—Dean O Takaoka
(74) *Attorney, Agent, or Firm*—Jianq Chyun IP Office

(57) ABSTRACT

Provided is a switching apparatus connecting a transmission line designated among transmission lines, between input and output terminals, and preventing a signal at the terminal from leaking to a control wiring, becoming a noise, and being superposed onto a signal at the other end. The switching apparatus includes: a plurality of input series switches switching the connection state between one end of the transmission lines and the input terminal according to a control signal; a plurality of output series switches switching the connection state between the other end of the transmission lines and the output terminal according to a control signal; a plurality of control wirings that supply a control signal to the input series switch and the output series switch; and a noise removal section that is provided between the input series switch and the output series switch and that reduces a noise propagated via a control wiring.

6 Claims, 3 Drawing Sheets

SWITCHING DEVICE, AND TESTING APPARATUS

BACKGROUND

1. Technical Field

The present invention relates to a switching apparatus and a test apparatus. In particular, the present invention relates to a switching apparatus, and a test apparatus, connecting a transmission line designated from among a plurality of transmission lines provided between an input terminal and an output terminal.

2. Related Art

A switching apparatus including a plurality of transmission lines provided between an input terminal and an output terminal, and transmitting a signal by selecting one transmission line designated from among the plurality of transmission lines by means of a control signal is known. Such a known switching apparatus connects the selected transmission line between the input terminal and the output terminal. For example, the plurality of transmission lines may be a plurality of transmission lines having different attenuation quantity of signals from each other. According to this, the switching apparatus is able to select between outputting an input signal after attenuation, and/or selecting the attenuation quantity by which the input signal is to be attenuated. For example in a test apparatus for testing the characteristics of a device under test, such a switching apparatus is usable for outputting a test signal to be supplied to a device under test after switching between attenuating the test signal to a predetermined amplitude and not attenuating the test signal, and the like.

In connecting one transmission line selected from among a plurality of transmission lines, between the input terminal and the output terminal, the switching apparatus cuts off the other transmission lines, from the input terminal and the output terminal. When pursuing this, there are cases where, for example in the switching apparatus, a signal applied to the switch having been cut off is propagated along a control wiring as a noise by being conveyed to the control wiring by means of the capacitance coupling or the like. Moreover, such a noise may reach the switch at the output side by being propagated on the control wiring, and be superposed on an output signal by means of the capacitive coupling again. In such a case, it becomes difficult to transmit the test signal with accuracy, and further to test a device under test with accuracy or to measure the characteristics of a device under test with accuracy.

SUMMARY

In view of this, it is an object of one aspect of the present invention to provide a switching apparatus and a test apparatus that are capable of solving the foregoing problems. This object is achieved by combinations of features described in the independent claims. The dependent claims define further advantageous and concrete examples of the present invention.

According to a first aspect related to the innovations herein, one exemplary switching apparatus is a switching apparatus for connecting a transmission line designated from among a plurality of transmission lines, between an input terminal and an output terminal, the switching apparatus including: a plurality of input series switches provided in correspondence with the plurality of transmission lines, each input series switch switching a connection state between one end of a corresponding transmission line and the input terminal according to a control signal; a plurality of output series switches provided in correspondence with the plurality of transmission lines, each output series switch switching a connection state between the other end of the corresponding transmission line and the output terminal according to a control signal; a plurality of control wirings provided in correspondence with the plurality of transmission lines, each control wiring supplying a control signal to the input series switch and the output series switch that correspond to the transmission line; and a noise removal section that is provided between the input series switch and the output series switch on at least one of the control wirings and that reduces a noise propagated from the input series switch to the output series switch via the control wiring.

The summary clause does not necessarily describe all necessary features of the embodiments of the present invention. The present invention may also be a sub-combination of the features described above.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

Figure 1:
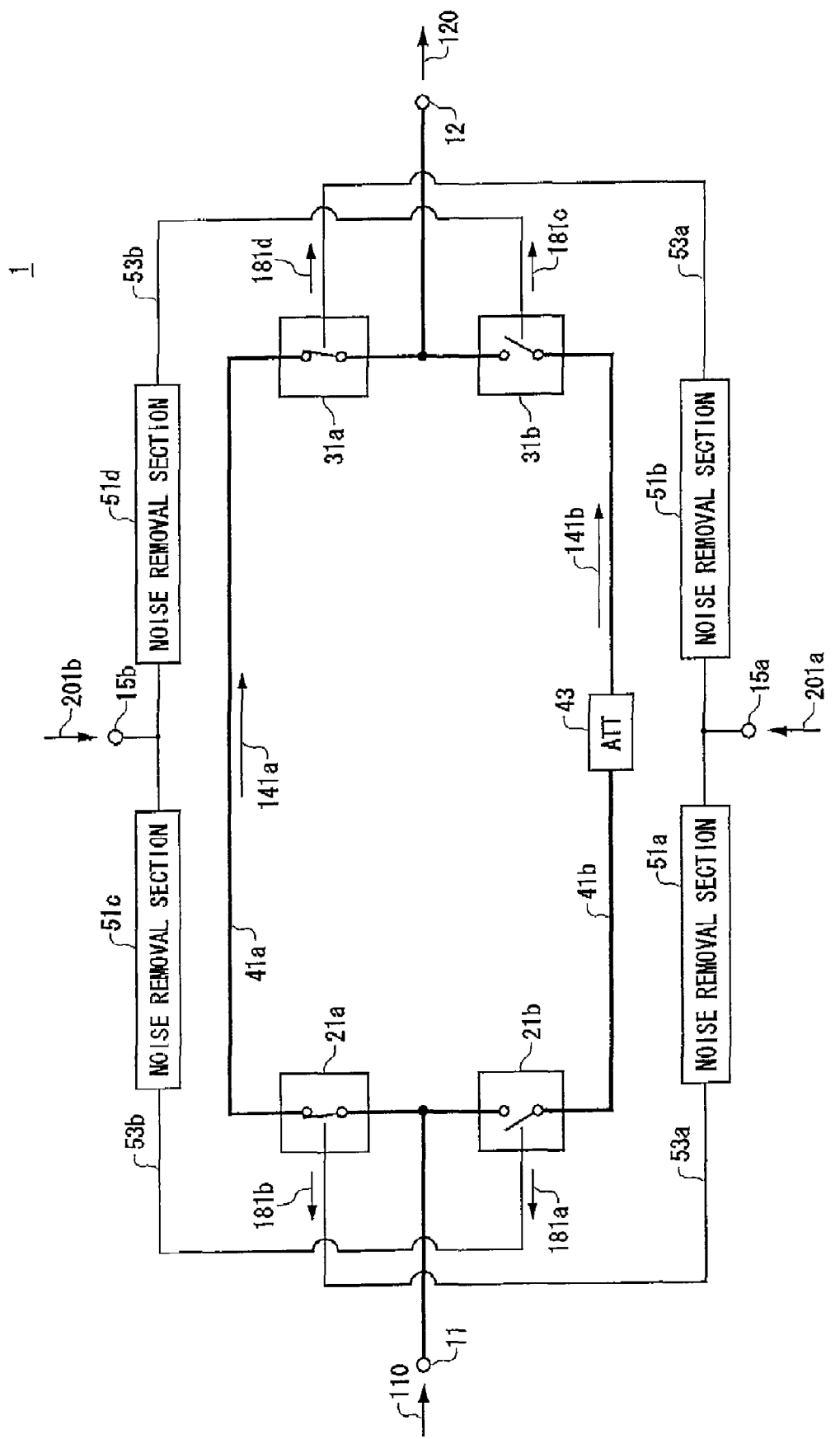
FIG. 1 shows an exemplary schematic configuration of a switching apparatus 1 according to one embodiment.

FIG. 1 shows an exemplary schematic configuration of a switching apparatus 1 according to one embodiment. The switching apparatus 1 according to the present embodiment restrains propagation of a noise from the input side to the output side via the control wiring for controlling the switch.

The switching apparatus 1 connects between the input terminal 11 and the output terminal 12, by a transmission line designated from between a first transmission line 41a and a second transmission line 41b. The switching apparatus 1 includes a first input series switch 21a, a second input series switch 21b, a first output series switch 31a, a second output series switch 31b, a first control wiring 53a, a second control wiring 53b, a first input noise removal section 51a, a first output noise removal section 51b, a second input noise removal section 51c, and a second output noise removal section 51d.

The input terminal 11 receives, from outside, an input signal 110 to be propagated to the output side by the switching apparatus 1. For example, the input signal 110 may be a test signal used for a test apparatus for testing a wireless apparatus or the like. The output terminal 12 outputs, to outside, a signal having inputted from the input terminal 11 and having passed the transmission line designated by the switching apparatus 1.

The first transmission line 41a and the second transmission line 41b are provided to be parallel between the input terminal 11 and the output terminal 12. The first transmission line 41a and the second transmission line 41b propagate the input signal 110 to the output terminal 12, after attenuating the input signal 110 by a different attenuation quantity from each other.

The first transmission line 41a may be a line electrically connecting the input terminal 11 and the output terminal 12, for example. That is, the first transmission line 41a may be a line (a line having an attenuation quantity of substantially 0 dB) that does not attenuate the first transmission signal 141a to be propagated, between the input terminal and the output terminal. Also in a different example, the first transmission line 41a may have, on the line, an attenuator having an attenuation quantity different from those of the other transmission lines.

The second transmission line 41b may be a line that has an attenuator 43 having a predetermined attenuation quantity, between the input terminal 11 and the output terminal 12. Here, the second transmission line 41b may be a line that attenuates the second transmission signal 141b to be propagated, by an attenuation quantity larger than that of the first transmission line 41a. To be more specific, the second transmission line 41b may attenuate, by means of the attenuator 43, the signal level of the second transmission signal 141b to be propagated, by an attenuation quantity predetermined in the specification, for example.

The first control input section 15a inputs the first control signal 201a from a control apparatus controlling switching of the switching apparatus 1. The first control signal 201a controls the first input series switch 21a and the first output series switch 31a at substantially the same timing and to be in the same ON/OFF state. Likewise, the second control signal 201b controls the second input series switch 21b and the second output series switch 31b at substantially the same timing and to be in the same ON/OFF state.

In addition, the first control signal 201a and the second control signal 201b are inputted so as to bring one of the first input series switch 21a and the second input series switch 21b to be in an ON state and the other thereof to be in an OFF state. For example, when both of the first input series switch 21a and the second input series switch 21b are a transistor of the same channel type, the second control signal 201b will be a signal resulting from reversing the first control signal 201a.

The first control wiring 53a is provided in correspondence with the first transmission line 41a. The first control wiring 53a is connected to the first input series switch 21a and the first output series switch 31a corresponding to the first transmission line 41a, and supplies the first control signal 201a to these switches. The second control wiring 53b is provided in correspondence with the second transmission line 41b. The second control wiring 53b is connected to the second input series switch 21b and the second output series switch 31b corresponding to the second transmission line 41b, and supplies the second control signal 201b to these switches.

The first input series switch 21a and the second input series switch 21b are provided in series between the starting end of the first transmission line 41a and the starting end of the second transmission line 41b with the input terminal 11 therebetween. The first input series switch 21a and the second input series switch 21b exclusively switch between whether to input the input signal 110 to the first transmission line 41a and to the second transmission line 41b, according to the first control signal 201a and the second control signal 201b.

The first input series switch 21a is provided in correspondence with the first transmission line 41a. The first input series switch 21a switches the connection state between an end of the corresponding first transmission line 41a and the input terminal 11, according to the first control signal 201a. More specifically, the first input series switch 21a is brought to be in the OFF state, when the first transmission line 41a is not connected to the input terminal 11. Even in such a case, however, the input signal 110 is applied to the end of the first input series switch 21a, the end being towards the input terminal 11. The input signal 110 sometimes leaks to the end towards the first control wiring 53a, by being coupled by the capacity for example between the gate and the source/drain in the first input series switch 21a. As a result, the leaked input signal 110 may flow into the first control wiring 53a, as a second input transmission noise 181b.

The second input series switch 21b is provided in correspondence with the second transmission line 41b, and switches the connection state between an end of the corresponding second transmission line 41b and the input terminal 11, according to the second control signal 201b. More specifically, the second input series switch 21b is brought to be in the OFF state, when the second transmission line 41b is not connected to the input terminal 11. Even in such a case, however, the input signal 110 is applied to the end of the second input series switch 21b, the end being towards the input terminal 11. The input signal 110 sometimes leaks to the end towards the second control wiring 53b, by being coupled by the capacity for example between the gate and the source/drain in the second input series switch 21b. As a result, the leaked input signal 110 may flow into the second control wiring 53b, as a first input transmission noise 181a.

The first output series switch 31a and the second output series switch 31b are provided in series between the finishing end of the first transmission line 41a and the finishing end of the second transmission line 41b with the output terminal 12 therebetween. The first output series switch 31a and the second output series switch 31b exclusively switch between whether to output the first transmission signal 141a as the output signal 120, and to output the second transmission signal 141b as the output signal 120, according to the first control signal 201a and the second control signal 201b.

The first output series switch 31a is provided in correspondence with the first transmission line 41a. The first output series switch 31a switches the connection state between the other end of the corresponding first transmission line 41a and the output terminal 12, according to the first control signal 201a. The first output series switch 31a is brought to be in the OFF state, when the first transmission line 41a is not connected to the output terminal 12.

The second output series switch 31b is provided in correspondence with the second transmission line 41b. The second output series switch 31b switches the connection state between the other end of the corresponding second transmission line 41b and the output terminal 12, according to the second control signal 201b. The second output series switch 31b is brought to be in the OFF state, when the second transmission line 41b is not connected to the output terminal 12.

The first input series switch 21a, the second input series switch 21b, the first output series switch 31a, and the second output series switch 31b may be a semiconductor switch such as a FET (field-effect transistor) such as a MOSFET, or may be a HEMT (high-electron-mobility transistor) or a pin diode. Note that in the present embodiment, each switch is explained to be a transistor of the same channel. However even if switches being transistors of channels different from each other are adopted, the switching apparatus can still be realized by the similar configuration.

The first input noise removal section 51a and the first output noise removal section 51b are provided between the first input series switch 21a and the first output series switch 31a on the first control wiring 53a, with the first control input section 15a therebetween, and function as a noise removal section. The first input noise removal section 51a and the first output noise removal section 51b reduce a noise propagated from the first input series switch 21a to the first output series switch 31a via the first control wiring 53a.

The first input noise removal section 51a and the first output noise removal section 51b reduce or remove the second input transmission noise 181b flown into the first control wiring 53a. According to this, the first input noise removal section 51a and the first output noise removal section 51b prevent the second input transmission noise 181b from reaching the gate of the first output series switch 31a via the first control wiring 53a, to be outputted to the output terminal 12 by the capacitive coupling. The first input noise removal section 51a and the first output noise removal section 51b may be a low-pass filter removing the resistance or the high-frequency noise, or the like.

The second input noise removal section 51c and the second output noise removal section 51d are provided between the second input series switch 21b and the second output series switch 31b on the second control wiring 53b, with the second control input section 15b therebetween, and function as a noise removal section. The second input noise removal section 51c and the second output noise removal section 51d reduce a noise propagated from the second input series switch 21b to the second output series switch 31b via the second control wiring 53b.

The second input noise removal section 51c and the second output noise removal section 51d reduce or remove the first input transmission noise 181a of a high frequency flown into the second control wiring 53b. According to this, the second input noise removal section 51c and the second output noise removal section 51d prevent the first input transmission noise 181a from reaching the gate of the second output series switch 31b via the second control wiring 53b, to be outputted to the output terminal 12 by the capacitive coupling. The second input noise removal section 51c and the second output noise removal section 51d may be a low-pass filter removing the resistance or the high-frequency noise, or the like.

In this way, according to the switching apparatus 1, each noise removal section 51a-51d is able to remove the noise generated by leaking of the input signal 110 from the input terminal 11 to the first control wiring 53a or to the second control wiring 53b. Accordingly, the switching apparatus 1 is able to prevent the input signal 110 from the input terminal 11, from leaking to the first control wiring 53a and to the second control wiring 53b, becoming a noise, and being superposed to an output signal at the output terminal 12. In the switching apparatus 1 according to the present embodiment, it is also possible to use the input terminal 11 and the output terminal 12 by reversing the input/output thereof. In such a case, it is also possible to remove the noise having leaked to the control wiring from the output terminal 12.

Figure 2:
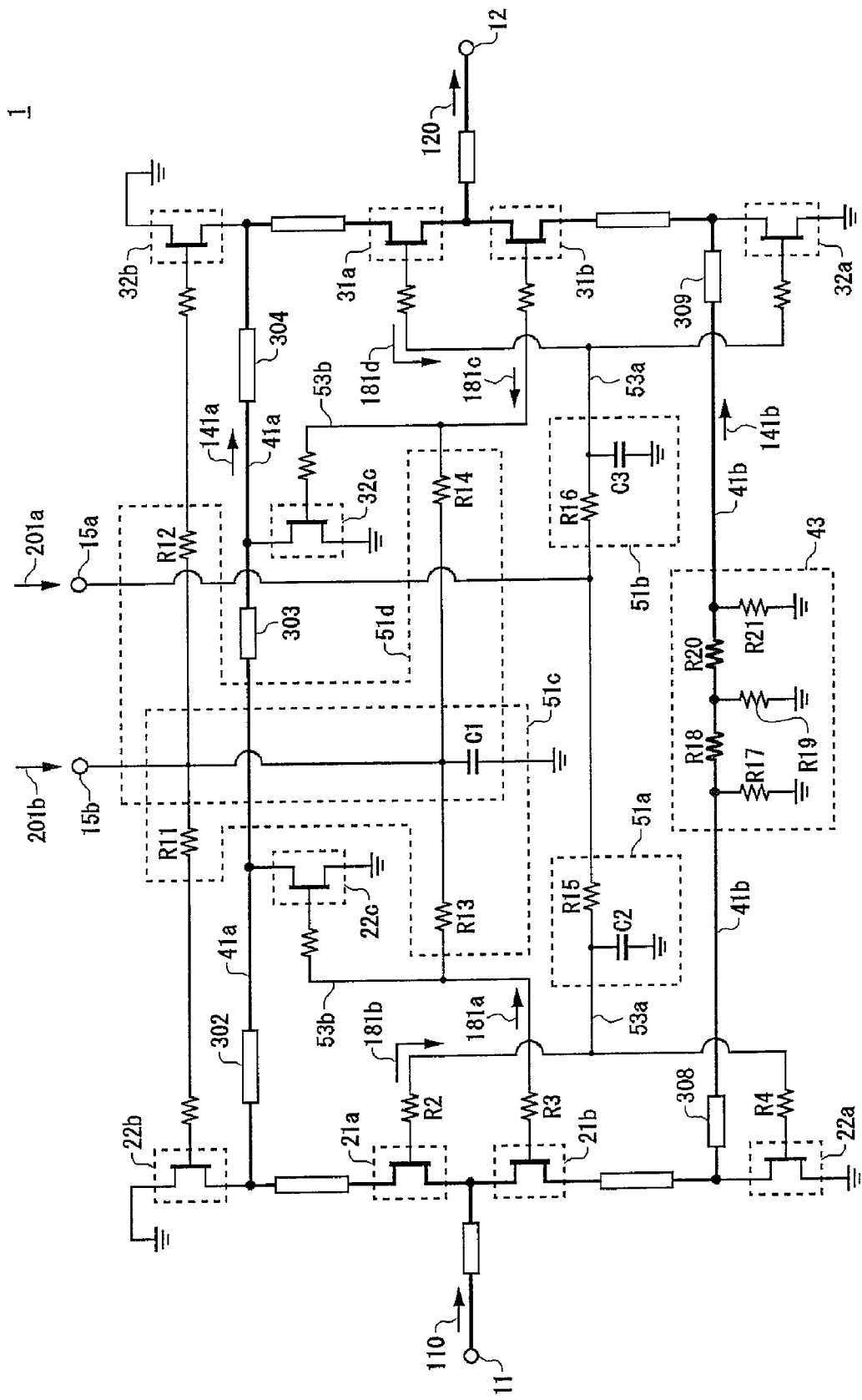
FIG. 2 shows an exemplary detailed configuration of the switching apparatus 1 illustrated in FIG. 1.

FIG. 2 shows a modification example of the switching apparatus 1 illustrated in FIG. 1. In the switching apparatus 1 shown in FIG. 2, members having the same function and configuration as those of the switching apparatus 1 shown in FIG. 1 are assigned the same reference numerals, and explanation thereof that overlaps with FIG. 1 is omitted in the following.

The switching apparatus 1 may include a resistance and a wiring positioned so that the resistance component from the first control input section 15a up to the gate terminal of each semiconductor switch (21a, 22a, 31a, 32a) will be substantially the same. In addition, the switching apparatus 1 may include a resistance and a wiring positioned so that the resistance component from the second control input section 15b up to the gate terminal of each semiconductor switch (21b, 22b, 22c, 31b) will be substantially the same.

In the switching apparatus 1 according to the present embodiment, the first transmission line 41a and the second transmission line 41b differ in signal attenuation quantity from each other. The first transmission line 41a does not include an attenuator therein, and so has a smaller attenuation quantity with respect to the carried signal than that of the second transmission line 41b. Accordingly, the signal level of the first transmission signal 141a carried by the first transmission line 41a is higher than the signal level of the second transmission signal 141b carried by the second transmission line 41b.

For example, the first transmission line 41a and the second transmission line 41b may be formed by a plurality of line segments such as from a line segment 302 to a line segment 304, and from a line segment 308 to a line segment 309. In the first transmission line 41a and the second transmission line 41b, the characteristic impedance from the line segment 302 to the line segment 304, and the characteristic impedance from the line segment 308 to the line segment 309 may be substantially the same, for example. In such a case, each semiconductor switch may be placed in substantially the constant interval therebetween, on the first transmission line 41a and the second transmission line 41b.

The attenuator 43 may be one-or-more-stage $\pi$-type circuits and being formed on the wiring resistance, for example. One example thereof is two-stage $\pi$-type circuits. When the attenuator 43 is provided with two stages of $\pi$-type circuits, the first-stage $\pi$-type circuit for example includes a resistance R18 provided on the second transmission line 41b, and a resistance R17 and a resistance R19 provided between both ends of the resistance R18 and the ground. The second-stage $\pi$-type circuit for example includes a resistance R20 provided on the second transmission line 41b, and a resistance R19 and a resistance R21 provided between both ends of the resistance R20 and the ground. In the present embodiment, the resistance R19 is shared by both of the $\pi$-type circuits. Another example of the attenuator 43 is an attenuator of a T-type circuit. In addition, each resistance of the attenuator 43 may be a variable resistance.

Since the attenuation quantity of the second transmission line 41b is large, the signal level of the second transmission signal 141b will be lower than the signal level of the first transmission signal 141a. However, the noise level of the second input transmission noise 181b will not be lower than the noise level of the first input transmission noise 181a. Consequently, the noise level of the second input transmission noise 181b with respect to the signal of the second transmission signal 141b will be relatively higher than the noise level of the first input transmission noise 181a with respect to the signal level of the first transmission signal 141a. From this reason, it is preferable to reduce the noise with respect to the first control wiring 53a compared to the noise with respect to the second control wiring 53b.

The first control wiring 53a applies the first control signal 201a inputted to the first control input section 15a, to the first input series switch 21a and the first output series switch 31a aforementioned above, and carries the same to the first input shunt switch 22a and the first output shunt switch 32a as well. The second control wiring 53b applies the second control signal 201b inputted to the second control input section 15b, to the second input series switch 21b and the second output series switch 31b aforementioned above, and carries the same to the second input shunt switch 22b and the second output shunt switch 32b as well.

The first control signal 201a switches the connection state between the first input series switch 21a and the first input shunt switch 22a and between the first output series switch 31a and the first output shunt switch 32a, either to the ON state or to the OFF state altogether. The second control signal 201b switches the connection state between the second input series switch 21b and the second input shunt switch 22b and between the second output series switch 31b and the second output shunt switch 32b, either to the ON state or to the OFF state altogether. According to this, the first control signal 201a, in connecting the input terminal 11 and the output terminal 12 to the first transmission line 41a, concurrently connects both ends of the second transmission line 41b to the ground. Likewise, the second control signal 201b, in connecting the input terminal 11 and the output terminal 12 to the second transmission line 41b, concurrently connects both ends of the first transmission line 41a to the ground.

Each switch (21a, 21b, 22a, 22b) at the signal input side constitutes a switch of a series-shunt type, by serial (series) connection of the switches 21a and 21b to the transmission line, and parallel (shunt) connection of the switches 22a and 22b to the transmission line. Also, each switch (31a, 31b, 32a, 32b) at the signal output side constitutes a switch of a series-shunt type, by serial connection of the switches 31a and 31b to the transmission line, and parallel connection of the switches 32a and 32b to the transmission line. Each switch (21a, 21b, 22a, 22b, 22c, 31a, 31b, 32a, 32b, 32c) may be a semiconductor switch such as a FET (field-effect transistor) such as a MOSFET, or may be a HEMT (high-electron-mobility transistor) or a pin diode.

The first input series switch 21a and the first output series switch 31a, and the first input shunt switch 22a and the first output shunt switch 32a are provided in correspondence with the first transmission line 41a. In addition, the second input series switch 21b and the second output series switch 31b, and the second input shunt switch 22b and the second output shunt switch 32b are provided in correspondence with the second transmission line 41b.

In the first input series switch 21a, a source terminal is connected to the starting end of the first transmission line 41a, a drain terminal is connected to the input terminal 11, and a gate terminal is connected to the first control wiring 53a, for example. The first input series switch 21a inputs the input signal 110 from the input terminal 11 to the first transmission line 41a, when being brought to the ON state by the first control signal 201a. Conversely, when being brought to the OFF state by the first control signal 201a, the first input series switch 21a does not input the input signal 110 from the input terminal 11 to the first transmission line 41a.

In the second input series switch 21b, a source terminal is connected to the finishing end of the second transmission line 41b, a drain terminal is connected to the input terminal 11, and a gate terminal is connected to the second control wiring 53b, for example. The second input series switch 21b inputs the input signal 110 from the input terminal 11 to the second transmission line 41b, when being brought to the ON state by the second control signal 201b. Conversely, when being brought to the OFF state by the second control signal 201b, the second input series switch 21b does not input the input signal 110 from the input terminal 11 to the second transmission line 41b.

In the first output series switch 31a, a source terminal is connected to the starting end of the first transmission line 41a, a drain terminal is connected to the output terminal 12, and a gate terminal is connected to the first control wiring 53a, for example. The first output series switch 31a outputs the first transmission signal 141a (input signal 110) from the first transmission line 41a to the output terminal 12, when being brought to the ON state by the first control signal 201a. Conversely, when being brought to the OFF state by the first control signal 201a, the first output series switch 31a does not output the first transmission signal 141a from the first transmission line 41a to the output terminal 12.

In the second output series switch 31b, a source terminal is connected to the finishing end of the second transmission line 41b, a drain terminal is connected to the output terminal 12, and a gate terminal is connected to the second control wiring 53b, for example. The second output series switch 31b outputs the second transmission signal 141b (input signal 110) from the second transmission line 41b to the output terminal 12, when being brought to the ON state by the second control signal 201b. Conversely, when being brought to the OFF state by the second control signal 201b, the second output series switch 31b does not output the second transmission signal 141b from the second transmission line 41b to the output terminal 12.

The first input shunt switch 22a and the first output shunt switch 32a switch the connection state whether to connect one end and the other end of the second transmission line 41b to the ground, according to the first control signal 201a. The second input shunt switch 22b, the second input shunt switch 22b, the second output shunt switch 32b, the shunt switch 22c, and the shunt switch 32c switch the connection state whether to connect one end of the first transmission line 41a to the ground, according to the second control signal 201b.

The second output shunt switch 32b switch the connection state whether to connect one end and the other end of the first transmission line 41a as well as each connection point on the first transmission line 41a, to the ground, according to the second control signal 201b. The second input shunt switch 22b, the second output shunt switch 32b, the shunt switch 22c, and the shunt switch 32c may be placed in an interval in accordance with a predetermined capacity component of each switch, in the first transmission line 41a.

As stated above, the switching apparatus 1 according to the present embodiment connects, to the ground, both ends of the transmission line not connected to the input/output terminal, in switching between the first transmission line 41a and the second transmission line 41b. Therefore, it becomes possible to reduce the noise leaking to the control wiring from the transmission line not connected to the input/output terminal.

The first input noise removal section 51a includes a resistance R15 connected in series between the first input series switch 21a and the first output series switch 31a on the corresponding first control wiring 53a, and a capacitor C2 provided between the corresponding first control wiring 53a and the ground. Here, the capacitor C2 is connected to a connection point nearer to the first input series switch 21a than to the midpoint between the first input series switch 21a and the first output series switch 31a on the first control wiring 53a. The first input noise removal section 51a functions as a low-pass filter to remove the second input transmission noise 181b.

The first output noise removal section 51b includes a resistance R16 connected in series between the first input series switch 21a and the first output series switch 31a on the corresponding first control wiring 53a, and a capacitor C3 provided between the corresponding first control wiring 53a and the ground. Here, the second capacitor C3 is connected to a connection point nearer to the first output series switch 31a than to the midpoint. The first output noise removal section 51b functions as a low-pass filter to remove the second output transmission noise 181d.

The first input noise removal section 51a and the first output noise removal section 51b are provided to dispersed on the first control wiring 53a, and each has a capacitor of a predetermined capacity independently. Therefore, the first input noise removal section 51a and the first output noise removal section 51b have a higher noise removal capability than in a case where a capacitor of a predetermined capacity is provided in one place. Here, the values of the resistance R16 and the resistance R16, the capacities of the capacitors C2 and C3 may be values enabling to remove the noise of a frequency for removal purpose, for example. As an example, the resistance R15 and the resistance R16 may be 750Ω, and the capacitors C2 and C3 may be several pF.

The second input noise removal section 51c includes a resistance R11, a resistance R13 connected in series between the second input series switch 21b and the second input shunt switch 22b, and between the second output series switch 31b and the second output shunt switch 32b on the corresponding second control wiring 53b, and a capacitor C1 provided between the corresponding second control wiring 53b and the ground. The second input noise removal section 51c functions as a low-pass filter to remove the first input transmission noise 181a. As one example, the resistance R13 may be 750Ω, and the capacitor C1 may be from 2 pF to 5 pF (or to 6 pF).

The second output noise removal section 51d includes a resistance R12, a resistance R14 connected in series between the second input series switch 21b and the second input shunt switch 22b, and between the second output series switch 31b and the second output shunt switch 32b on the corresponding second control wiring 53b, and a capacitor C1 provided between the corresponding second control wiring 53b and the ground. The second output noise removal section 51d functions as a low-pass filter to remove the high-frequency component of the first output transmission noise 181c. As one example, the resistance R14 may be 750Ω, and the capacitor C1 may be from 2 pF to 5 pF (or to 6 pF). The capacitor C1 is connected to the midpoint between the second input series switch 21b and the second output series switch 31b on the second control wiring 53b, and the midpoint between the second input shunt switch 22b and the second output shunt switch 32b.

In this way, the switching apparatus in the present embodiment has improved noise removal capability for the first control wiring 53a than for the second control wiring 53b. According to this, the switching apparatus 1 according to the present embodiment is able to restrain the effect of noise with respect to the second transmission signal 141b whose signal level is lower than that of the first transmission signal 141a.

In the switching apparatus according to the present embodiment, the number of capacitor C2 and capacitor C3 of the first input noise removal section 51a and the first output noise removal section 51b provided with respect to the first control wiring 53a corresponding to one transmission path (first transmission line 41a) is larger than the number of capacitor C1 of the second input noise removal section 51c and the second output noise removal section 51d provided with respect to the second control wiring 53b corresponding to the other transmission path (second transmission line 41b) whose attenuation quantity is larger than that of the one transmission path. In the switching apparatus according to the present embodiment, it becomes possible to reinforce the noise removal capability of the first control wiring 53a. For example, it becomes possible to enhance the S/N ratio of the propagated signal in the second transmission line 41b whose attenuation quantity is larger than that of the first transmission line 41a.

Figure 3:
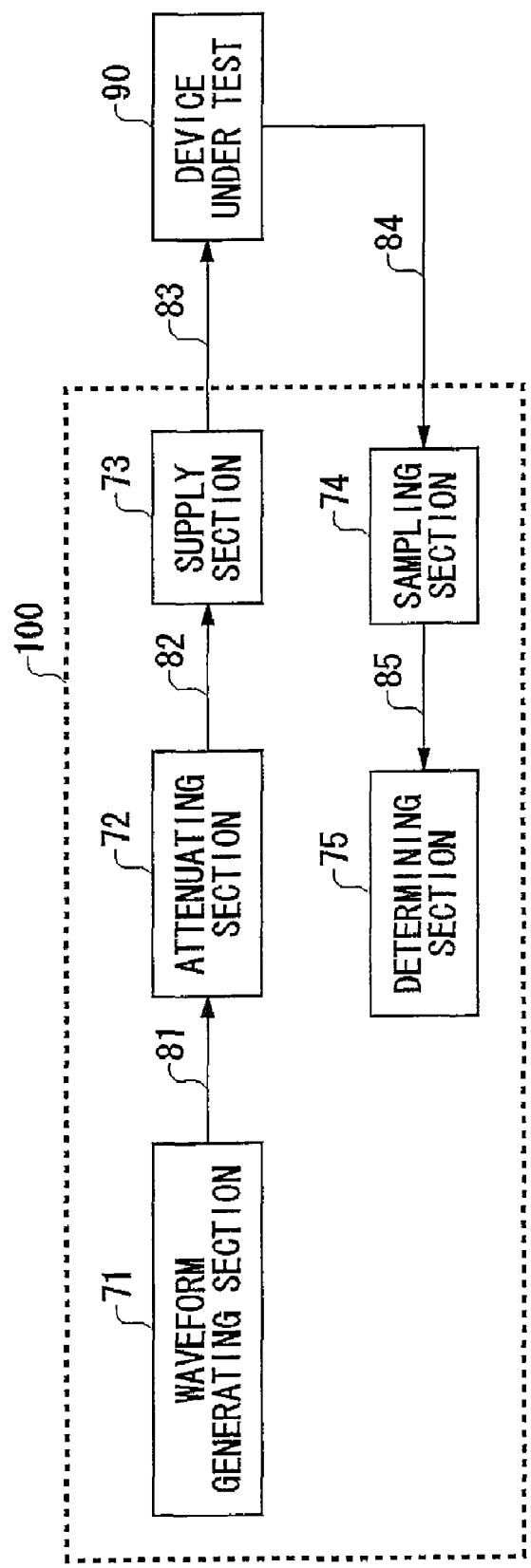
FIG. 3 shows an exemplary schematic configuration of a test apparatus 100 according to one embodiment.

FIG. 3 shows a schematic configuration of a test apparatus 100 according to one embodiment. The test apparatus 100 may be a test apparatus for testing a device under test 90. The test apparatus 100 includes a waveform generating section 71, an attenuation section 72, a supply section 73, a sampling section 74, and a determining section 75.

The waveform generating section 71 generates an analogue test signal 81 supplied to the device under test 90. For example, the waveform generating section 71 generates an analogue test signal 81 for the device under test 90. For example, in performing network analysis for measuring the frequency characteristic such as S parameter of the device under test 90, the waveform generating section 71 may sequentially generate test signals 81 having different frequency from each other, so as to sweep the frequency within a predetermined measurement frequency range.

The attenuating section 72 receives a test signal 81 generated by the waveform generating section 71, attenuates the test signal 81 by a predetermined attenuation quantity, and outputs the attenuated test signal 82. The attenuating section 72 may have a function and a configuration similar to those of the switching apparatus 1 described above in relation to FIG. 1 and FIG. 2, and may have a noise removal section having the similar configuration. For example, the attenuating section 72 receives the test signal 81 generated by the waveform generating section 71, at the input terminal 11, attenuates the received test signal 81 by a predetermined attenuation quantity to remove the noise thereof, and outputs the resulting attenuated test signal 82, to the supply section 73 via the output terminal 12.

In addition, the attenuating section 72 may be given a first control signal 201a and a second control signal 201b, by a user or the like. In addition, the waveform generating section 71 and so on may generate the first control signal 201a and the second control signal 201b according to a test program given in advance by a user or the like, prior to generating the test signal.

The supply section 73 supplies the attenuated test signal 82 attenuated by the attenuating section 72, to the device under test 90 as a supply test signal 83. For example, the supply section 73 may be a driver generating the electric current to be outputted or drawn in according to a test signal.

The sampling section 74 samples the waveform of a response signal 84 outputted by the device under test 90 according to the supply test signal 83. In addition, the sampling section 74 may sample a test signal inputted to the device under test 90, via the directional coupler provided between the supply section 73 and the device under test 90, in analyzing the network of the device under test 90. The sampling section 74 may be an AD converter converting a given signal into a digital signal.

The determining section 75 determines a test result of the device under test 90 (i.e. whether the device under test 90 has passed or failed the test), based on the sampling result 85 of the sampling section 74. For example, the determining section 75 may calculate the frequency characteristic or the like of an S parameter of the device under test 90, based on the sampling result obtained by sampling the waveform of the response signal 84 at the sampling section 74. In addition, the determining section 75 may determine whether the device under test 90 has passed or failed the test, based on whether the calculated frequency characteristic endures a predetermined usage or not.

According to such a configuration, in the attenuating section 72 of the test apparatus 100, noise having leaked to the control wiring is prevented from being propagated from the output side to the output signal side, when an analogue test signal 81 is outputted to the supply section 73 as an attenuated test signal 82. Accordingly, the attenuating section 72 in the test apparatus 100 according to the present embodiment is able to prevent the input signal 110 from the input terminal 11, from leaking to the first control wiring 53a and the second control wiring 53b, becoming noise, and being superposed onto the output signal 12 in the output terminal 12. In addition, the test apparatus 100 according to the present embodiment is able to control the amplitude of a test signal by means of the attenuating section 72 with accuracy. Therefore it becomes possible to test a device under test 90 with accuracy, and to measure the characteristic of a device under test 90 with accuracy.

In the above, some aspects of the present invention have been described by way of exemplary embodiments. However, it is needless to say that the technical scope of the present invention should not be limited by the above-described embodiments. It should be understood that those skilled in the art might make various types of modifications and substitutions to the above-described embodiments without departing from the spirit and the scope of the present invention. It is obvious from the appended claims that embodiments with such modifications or substitutions also belong to the technical scope of the present invention.

As is clear from the above explanation, according to the switching apparatus 1, even when transmitting an input signal after attenuating the input signal, it becomes possible to transmit the input signal without superimposing a noise thereto. In addition, according to the test apparatus 100, it becomes possible to test the characteristics of a device under test with accuracy.

What is claimed is:

1. A switching apparatus for connecting a transmission line designated from among a plurality of transmission lines, between an input terminal and an output terminal, the switching apparatus comprising:
    a plurality of input series switches provided in correspondence with the plurality of transmission lines, each input series switch switching a connection state between one end of a corresponding transmission line and the input terminal according to a control signal;
    a plurality of output series switches provided in correspondence with the plurality of transmission lines, each output series switch switching a connection state between the other end of the corresponding transmission line and the output terminal according to a control signal;
    a plurality of control wirings provided in correspondence with the plurality of transmission lines, each control wiring supplying a control signal to the input series switch and the output series switch that correspond to the transmission line; and
    a noise removal section that is provided between the input series switch and the output series switch on at least one of the control wirings and that reduces a noise propagated from the input series switch to the output series switch via the control wiring.

2. The switching apparatus as set forth in claim 1, wherein the noise removal section includes:
    a resistance connected in series between the input series switch and the output series switch on a corresponding control wiring; and
    a capacitor provided between a corresponding control wiring and the ground.

3. The switching apparatus as set forth in claim 2, wherein the plurality of transmission lines differ in signal attenuation quantity from each other, and the number of capacitors in the noise removal section provided for a control wiring corresponding to one transmission line is larger than the number of capacitors in the noise removal section provided for a control wiring corresponding to another transmission line whose attenuation quantity is larger than an attenuation quantity of the one transmission line.

4. The switching apparatus as set forth in claim 3, wherein the plurality of transmission lines include a first transmission line and a second transmission line, the switching apparatus further comprising:
    a first input shunt switch that switches between whether to connect one end of the first transmission line to the ground, according to a control signal;
    a first output shunt switch that switches between whether to connect the other end of the first transmission line to the ground, according to a control signal;
    a second input shunt switch that switches between whether to connect one end of the second transmission line to the ground, according to a control signal; and
    a second output shunt switch that switches between whether to connect the other end of the second transmission line to the ground, according to a control signal, and wherein
    a first control wiring provided in correspondence with the first transmission line supplies a first control signal, to the first input series switch and the first output series switch, and the second input shunt switch and the second output shunt switch, which are provided in correspondence with the first transmission line, and
    a second control wiring provided in correspondence with the second transmission line supplies a second control signal, to the second input series switch and the second output series switch, and the first input shunt switch and the first output shunt switch, which are provided in correspondence with the second transmission line.

5. The switching apparatus as set forth in claim 4, wherein the second transmission line has a larger attenuation quantity than an attenuation quantity of the first transmission line,
    a first noise removal section provided for the first control wiring includes, on the first control wiring, a first capacitor connected to a connection point nearer to the first input series switch than to a midpoint between the first input series switch and the first output series switch, and a second capacitor connected to a connection point nearer to the first output series switch than to the midpoint, and
    a second noise removal section provided for the second control wiring includes, on the second control wiring, a third capacitor connected to a midpoint between the second input series switch and the second output series switch, and to a midpoint between the first input shunt switch and the first output shunt switch.

6. A test apparatus for testing a device under test, the test apparatus comprising:
    a waveform generating section that generates an analogue test signal to be supplied to the device under test;
    an attenuating section that attenuates the test signal;
    a supply section that supplies the attenuated test signal to the device under test; and
    a sampling section that samples a waveform of a response signal outputted by the device under test according to the test signal, wherein
    the attenuating section includes:
        a plurality of transmission lines that differ from each other in attenuation quantity; and
        a switching apparatus that connects a transmission line designated from among the plurality of transmission lines, between an input terminal and an output terminal,
    the switching apparatus including:
        a plurality of input series switches provided in correspondence with the plurality of transmission lines, each input series switch switching a connection state between one end of a corresponding transmission line and the input terminal according to a control signal;

a plurality of output series switches provided in correspondence with the plurality of transmission lines, each output series switch switching a connection state between the other end of the corresponding transmission line and the output terminal according to a control signal;

a plurality of control wirings provided in correspondence with the plurality of transmission lines, each control wiring supplying a control signal to the input series switch and the output series switch that correspond to the transmission line; and a noise removal section that is provided between the input series switch and the output series switch on at least one of the control wirings and that reduces a noise propagated from the input series switch to the output series switch via the control wiring.

* * * * *